United States Patent
Tsuchida (10) Patent No.: US 7,529,120 B2
(45) Date of Patent: May 5, 2009

(54) SEMICONDUCTOR MEMORY WITH RESISTANCE CHANGE ELEMENT

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 11/480,848

(22) Filed: Jul. 6, 2006

(65) Prior Publication Data

US 2007/0253237 A1 Nov. 1, 2007

(30) Foreign Application Priority Data

May 1, 2006 (JP) ............................ 2006-127760

(51) Int. Cl.
*G11C 11/00* (2006.01)
(52) U.S. Cl. .................. 365/158; 365/200; 365/196; 365/189.04; 365/189.07
(58) Field of Classification Search ............... 365/158, 365/200, 196, 189.04, 189.07
See application file for complete search history.

(56) References Cited

U.S. PATENT DOCUMENTS

| | | | | |
|---|---|---|---|---|
| 7,286,430 B2 * | 10/2007 | Hanzawa et al. | ....... | 365/189.15 |
| 7,313,042 B2 * | 12/2007 | Hidaka | ........................ | 365/209 |
| 2002/0093032 A1 * | 7/2002 | Hanzawa et al. | ............ | 257/200 |
| 2003/0002333 A1 * | 1/2003 | Hidaka | ........................ | 365/171 |
| 2004/0105304 A1 * | 6/2004 | Hidaka | ........................ | 365/158 |
| 2005/0270829 A1 * | 12/2005 | Ooishi | ........................ | 365/158 |

OTHER PUBLICATIONS

J. DeBrosse, et al. "A 16Mb MRAM Featuring Bootstrapped Write Drivers", 2004 Symposium on VLSI Circuits, Digest of Technical Papers, pp. 454-457.

* cited by examiner

*Primary Examiner*—Thong Q Le
(74) *Attorney, Agent, or Firm*—Oblon, Spivak, McClelland, Maier & Neustadt, P.C.

(57) ABSTRACT

A semiconductor memory includes a memory cell as a resistance change element and a switching element which are connected in series and a read word line connected to a control terminal of the switching element. In addition, the semiconductor memory includes a circuit which executes an auto-close operation for causing which makes a read word line RWL to be subjected to non-activation automatically after a fixed period from start of a read operation.

8 Claims, 11 Drawing Sheets

A: Auto-close timing
B: Start of write operation

SEMICONDUCTOR MEMORY WITH RESISTANCE CHANGE ELEMENT

CROSS-REFERENCE TO RELATED APPLICATIONS

This application is based upon and claims the benefit of priority from prior Japanese Patent Application No. 2006-127760, filed May 1, 2006, the entire contents of which are incorporated herein by reference.

BACKGROUND OF THE INVENTION

1. Field of the Invention

The present invention relates to a semiconductor memory with a resistance change element, and is used for a magnetic random access memory (MRAM).

2. Description of the Related Art

In recent years, development race for universal semiconductor memory has become active, the semiconductor memory advantageously having features of high speed, high integration, low power consumption and high reliability despite its non-volatility. One of them is a magnetic random access memory utilizing a magneto-resistive effect (for example, refer to "16 Mb MRAM Featuring Bootstrap Write Driver" 2004 Symposium on VLSI Circuits Digest of Technical Paper, pp. 455-457).

A memory cell of the magnetic random access memory is comprised of, for instance, a magnetic tunnel junction (MTJ) element as a resistance change element; and the MTJ element has a fundamental structure of a layered structure comprising a magnetic pinned layer, a magnetic free layer and a tunnel barrier layer existing therebetween.

In such a MTJ element, when the magnetization direction of the magnetic pinned layer is the same as that of the magnetic free layer, tunnel probability of the tunnel barrier layer becomes maximum, resulting in a minimum resistance value of the MTJ element. This state is defined as a parallel state which is caused to correspond to, for instance, "0".

Further, when the magnetization direction of the magnetic pinned layer is opposite to the magnetization direction of the magnetic free layer, tunnel probability of the tunnel barrier layer becomes minimum, resulting in a maximum resistance value of the MTJ element. This state is defined as an anti-parallel state which is caused to correspond to, for instance, "1".

Then, writing of data is carried out in such a way that, for instance, magnetization state of the MTJ elements is controlled while utilizing a magnetic field (current magnetic field) generated due to a write current, or a spin polarized electron generated by flowing spin injection current into the MTJ element, or the like. Further, read of data is carried out by flowing read current into the MTJ element and detecting its resistance value.

One of the problems to be solved, when the universal semiconductor memory represented by the above-described magnetic random access memory is put into practical use, is reduction of power consumption.

BRIEF SUMMARY OF THE INVENTION

According to one aspect of the present invention, there is provided a semiconductor memory comprising a memory cell as a resistance change element and a switching element which are connected in series, a read word line connected to a control terminal of the switching element, and a circuit which executes an auto-close operation for causing which makes the read word line to be subjected to non-activation automatically after a fixed period from start of a read operation.

According to another aspect of the present invention, there is provided a semiconductor memory comprising a memory cell as a resistance change element, a read line connected to the memory cell, a switching element connected between the read line and a sense amplifier, a column selection line connected to a control terminal of the switching element, and a circuit which executes an auto-close operation for causing which makes the column selection line to be subjected to non-activation automatically after a fixed period from start of a read operation.

According to another aspect of the present invention, further comprising a redundancy cell, and a redundancy circuit which outputs a hit signal to select one of the memory cell and the redundancy cell, wherein the hit signal is not reset by the auto-close operation.

DETAILED DESCRIPTION OF THE INVENTION

A semiconductor memory with a resistance change element of an aspect of the present invention will be described below in detail with reference to the accompanying drawings.

1. Outline

In an example of the present embodiment, reduction of electric power consumption is realized with decrease of current consumption at the time of read. Specifically, a semiconductor memory using a resistance change element as a memory cell carries an auto-close function.

The auto-close function is a function of starting read by rendering a selected word line from non-active state to active state; and automatically returning the selected word line to the non-active state after the read is completed, thereby reducing a read current (through current) flowing in a memory cell at the time of read.

Here, completion of the read is defined as a time point when the data of the memory cell has been judged with a sense amplifier.

As for the resistance change element, since the data is read out while flowing the read current in the resistance change element itself, it is preferable for reduction of the power consumption to stop the read current as soon as possible after the read is completed. The auto-close function satisfies this requirement.

By the way, in the semiconductor memory, there exists an interface with a specification in which the read and the writing are asynchronously performed. For instance, in a static random access memory (SRAM), when transition of an address is performed, first, a system is so configured that the operation mode is moved to the read; in the case of performing the writing, therefore, a specific command is supplied to the semiconductor memory after the transition of the address is performed.

On this occasion, we should pay attention to compatibility with a redundancy system. For instance, in one of the redundancy systems, there is one known as a block redundancy system. (Refer to, for instance, "Fault-Tolerant Design for 256 Mb DRAM" T. Kirihata et. al., 1995 Symposium on VLSI Circuits Digest of Technical Paper, pp. 107 to 108).

The block redundancy system is an effective technique for improvement of relief efficiency in which a redundancy cell array is not added to each of a plurality of blocks configuring a memory cell array, but one redundancy cell array (block) in common with these plural blocks is prepared separately from the memory cell array.

In this case, when transition of the address is performed, a hit signal determining whether the memory cell array is accessed or the redundancy cell array is accessed is updated. However, the hit signal is reset when the auto-close function is operated.

Therefore, if the hit signal is reset due to the auto-close function after the transition of the address is performed, when a specific command is inputted into the semiconductor memory and the transition to writing occurs, it is not possible to write the data in the accurate address.

Consequently, in an example of the present invention, part of the auto-close function is restricted. In other words, depending on the auto-close function, the hit signal relating to the access of the redundancy cell array is not reset.

Thus, in the example of the present invention, there is proposed a so-called half auto-close function in which part of the auto-close function is restricted. In this manner, in the semiconductor memory with the resistance change element as the memory cell, it is possible to realize SRAM specification (operation specification) in which power consumption at the time of read is low, and it has the most versatility and is easy to use.

By the way, such a specification has particularly good compatibility with the semiconductor memory capable of performing writing and read independently and in parallel; therefore, the example of the present invention is particularly effective in the magnetic random access memory.

2. Magnetic Random Access Memory

One of the semiconductor memories with the resistance change element as the memory cell is the magnetic random access memory.

Figure 1:
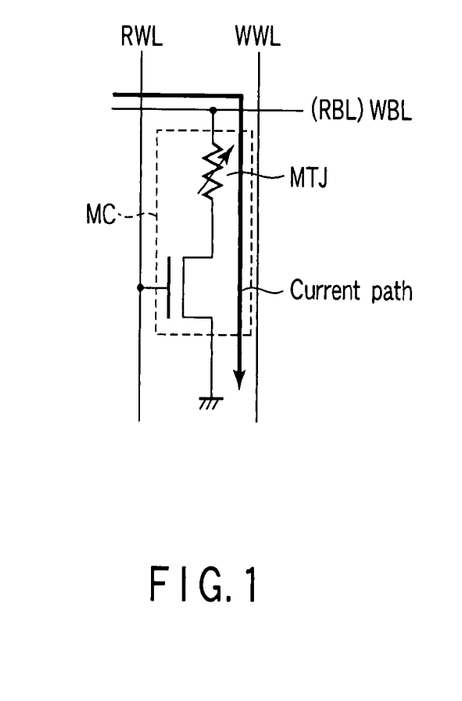
FIG. 1 is a view showing a memory cell of a magnetic random access memory.

An equivalent circuit of the memory cell of the magnetic random access memory, as shown in FIG. 1, is comprised of, for example, an MTJ element (a magnetoresistive element) and a MOS transistor (a switching element) connected in series. At the time of the read, since the read of the data is carried out while flowing the current from a read bit line RBL to an MTJ element by rendering a read word line RWL at a high potential, current is always consumed during the read operation.

Figure 2:
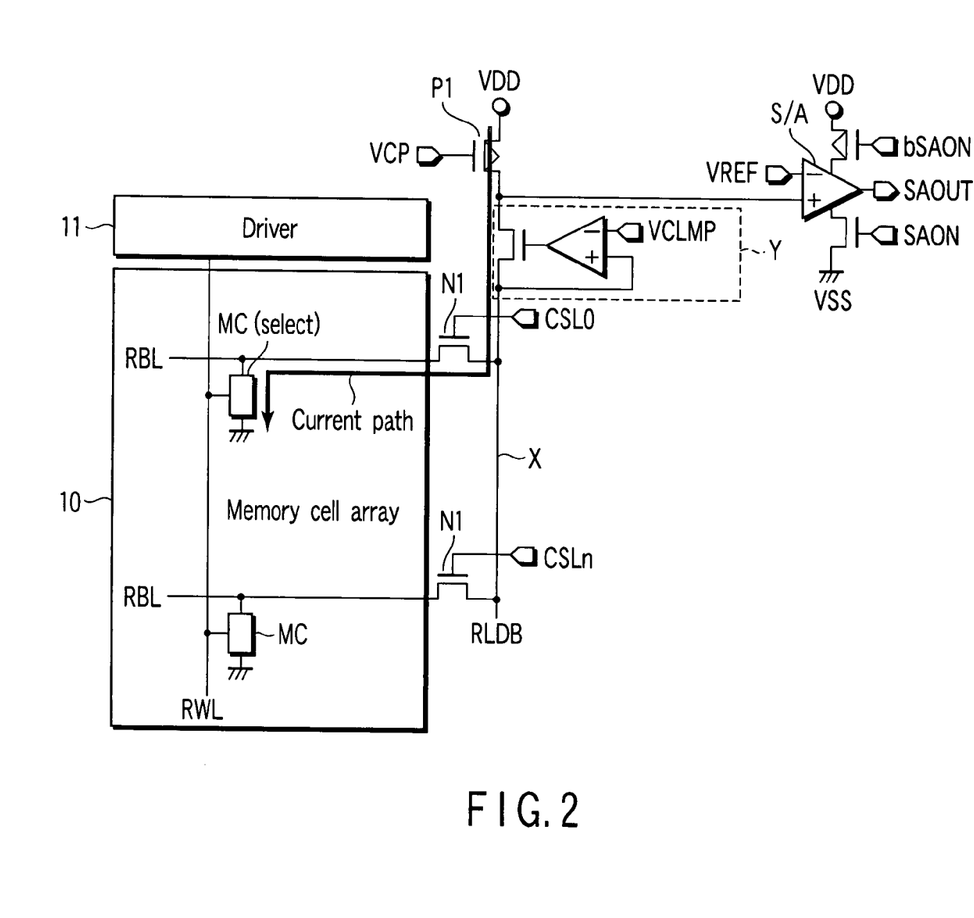
FIG. 2 is a view showing the magnetic random access memory as a reference example.

In the magnetic random access memory, as shown in FIG. 2, at the time of the read, current flows in a selected memory cell MC (select) within a memory cell array 10.

The read word line RWL is connected to a driver 11, and to a plurality of memory cells MC. The read bit line RBL is connected to a common node X via an N-channel MOS transistor (switching element) N1 to select a column.

The common node X is connected to a sense amplifier S/A via a clamp circuit Y. To a gate electrode of the MOS transistor N1, column selection lines CSL0, . . . CSLn are connected. A P-channel MOS transistor P1 as a current-voltage conversion element generates current when a control signal VCP becomes an intermediate voltage level.

The clamp circuit Y is a circuit for keeping forcibly the voltage of the read bit line RBL to the predetermined voltage (for example, 0.1 to 0.6V). This is provided, since the MR ratio of the MTJ element deteriorates in proportion to an increase of the voltage applied to its both ends, in order to prevent the deterioration and to secure a sufficient read margin.

Figure 3:
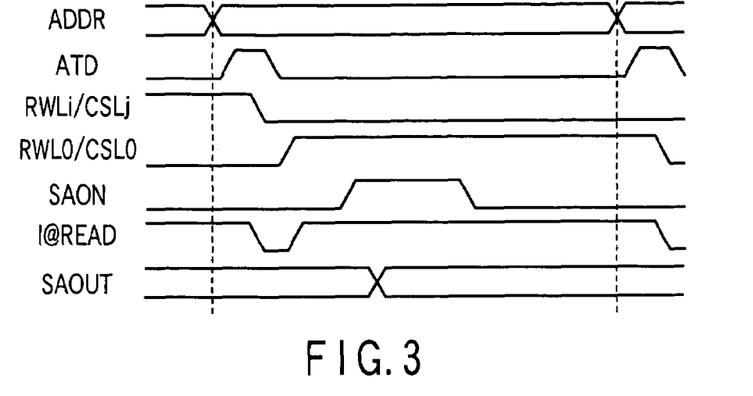
FIG. 3 is a view showing an operation waveform of an SRAM specification.

FIG. 3 shows a first example of a signal waveform at the time of read.

The example shows that signal waveform corresponds to an interface of the SRAM specification; and a read command is issued when the transition of the address is performed.

In this case, first, change of the address is detected with ATD (address transition detector), and subsequently, internal state of a chip is reset. In other words, a read word line RWLi and a column selection line CSLj are made non-activated. Further, based on the address, a selected read word line RWL0 and a selected column selection line CSL0 are made activated.

Then, a sense amplifier activation signal SAON is made to activate, the sense amplifier is caused to operate, and an output signal SAOUT in accordance with the data of the memory cell is obtained.

Here, although current I@READ flowing in the memory cell is interrupted temporarily in the period from the time RWLi/CSLj is made non-active to the time RWL0/CSL0 is activated, in the period other than that described above the current flows continuously, thereby resulting in a cause of increase of the power consumption.

Figure 4:
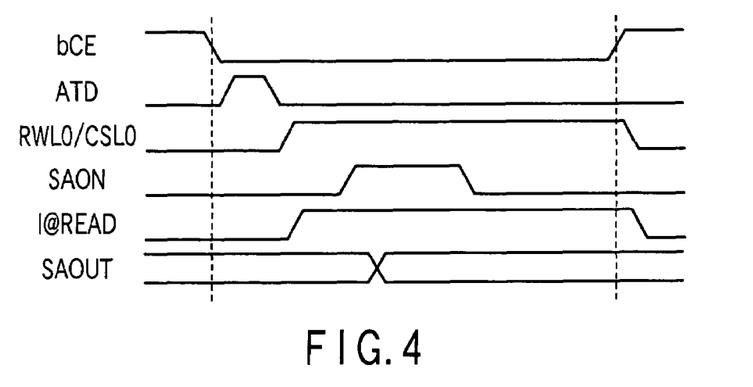
FIG. 4 is a view showing an operation waveform of a DRAM specification.

FIG. 4 shows a second example of the signal waveform at the time of read.

The signal waveform corresponds to the interface of DRAM (dynamic random access memory) specification; and there is a characteristic in that active state and pre-charge state of the chip are discriminated in accordance with a logical value of a chip enable signal bCE.

In this case, first, the chip enable signal bCE is made "L", the chip is made active, and the selected read word line RWL0 and the selected column selection line CSL0 are made active.

Then, the sense amplifier activation signal SAON is activated, the sense amplifier is caused to operate, and the output signal SAOUT in accordance with the data of the memory cell is obtained.

In this specification, like the first example, the current I@READ flows continuously in the read period. The second example differs from the first example in that the current I@READ is interrupted when it causes the chip enable signal bCE to change into the pre-charge state while making the chip enable signal bCE "H".

However, the current I@READ increases, when the chip becomes the active state frequently, thereby resulting in the memory with large current consumption.

3. Embodiment

There will be explained some embodiments which are conceivable as the best mode.

Hereinafter, there will be explained about a magnetic random access memory capable of performing the read and the writing independently and in parallel.

(1) First Embodiment

Figure 5:
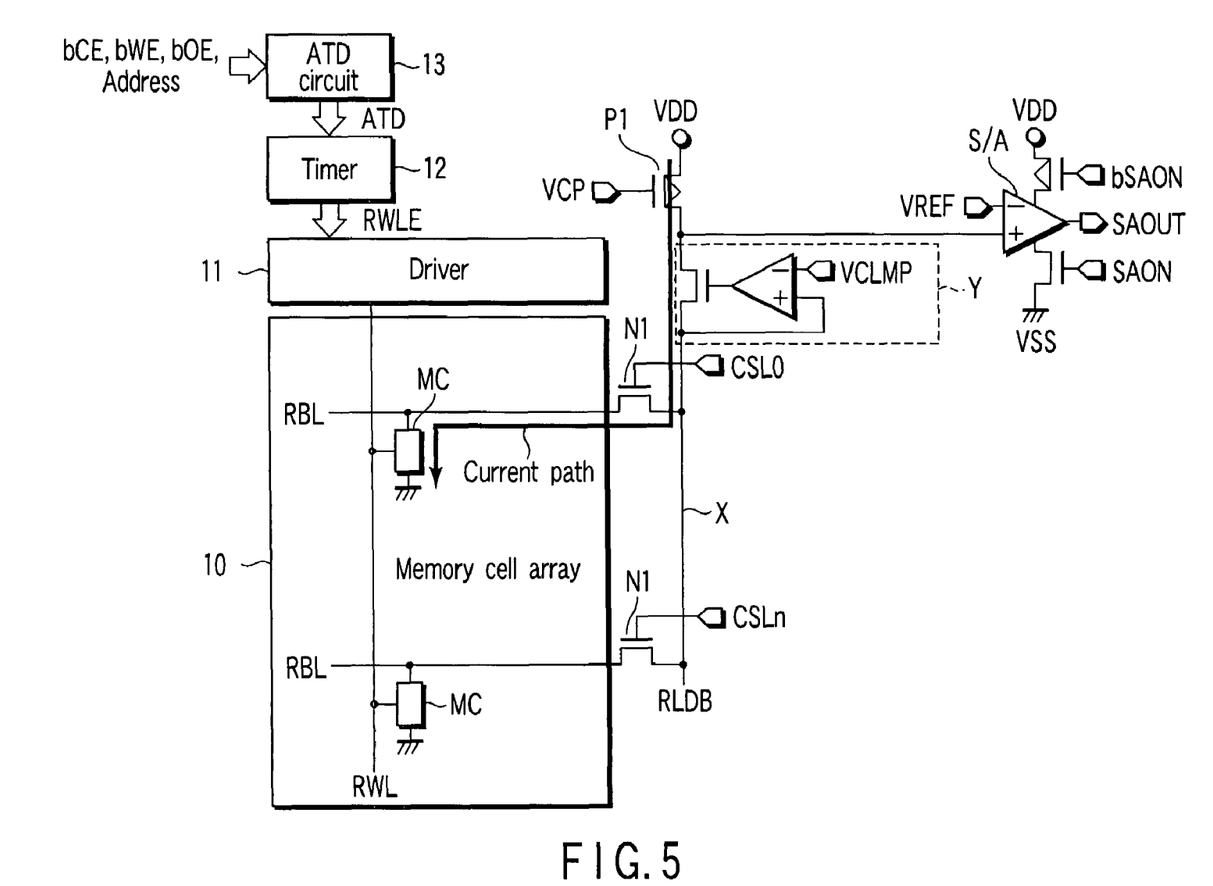
FIG. 5 is a view showing a magnetic random access Memory of a first embodiment.

FIG. 5 shows principal parts of the magnetic random access memory.

Different points from the magnetic random access memory of FIG. 2 as the reference example therebetween are, firstly, that a timer 12 for controlling driving time of the read word line RWL is newly provided. An output signal RWLE of the timer 12 is inputted to a driver 11 for driving the read word line RWL.

Secondly, another different point is that an operation of the timer 12 is controlled with an ATD circuit 13. The ATD circuit 13 outputs the ATD signal to the timer 12 when detecting the transition of the address.

Figure 6:
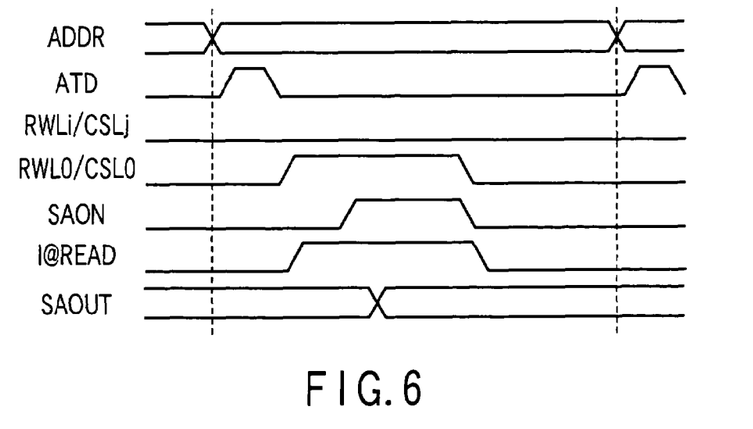
FIG. 6 is a view showing the operation waveform of the SRAM specification.

Then, in such a magnetic random access memory, as shown in FIG. 6, the operation is performed at the timing of the SRAM specification.

The characteristic of the signal waveform is that the selected read word line RWL0 results in non-activated state automatically after completion of the read, in other words, it has the auto-close function.

Specifically, when the transition of the address is performed, for a predetermined period from that point on, the timer 12 makes the selected read word line RWL0 active. After the predetermined period has elapsed, the timer 12 makes the selected read word line RWL0 non-active. The predetermined period is a sufficient time interval to complete the read.

The same control as this is capable of being performed about the selected column selection line CSL0. In other words, the auto-close function is capable of being applied to both or either one of the read word line and the column selection line.

Figure 7:
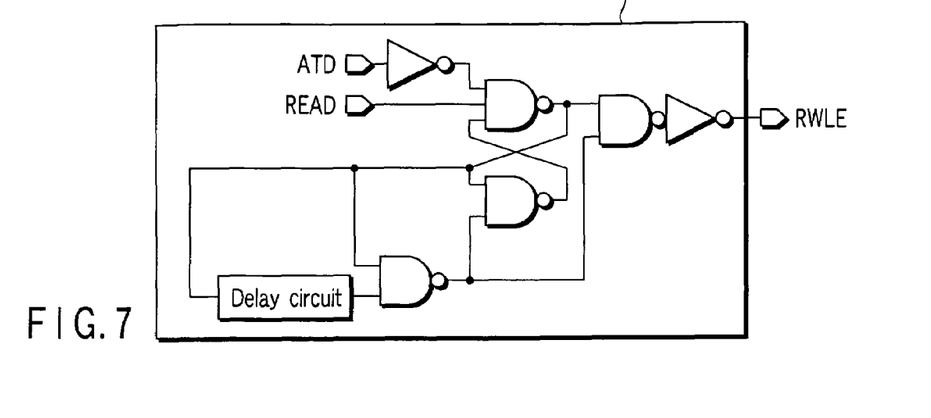
FIG. 7 is a view showing an example of a timer.
Figure 8:
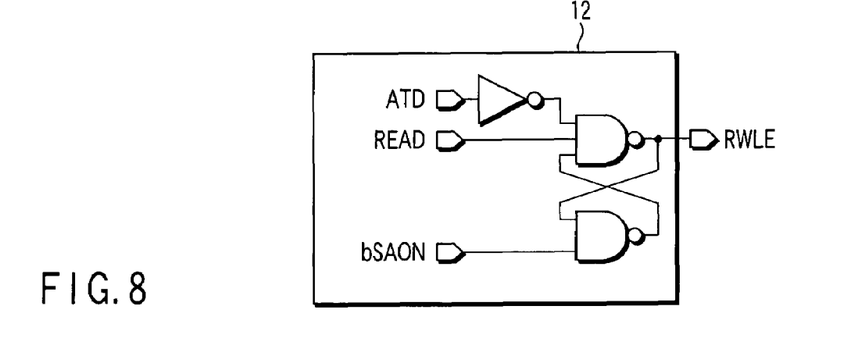
FIG. 8 is a view showing an example of a timer.

FIGS. 7 and 8 show examples of the timer.

FIG. 7 is an example in which an exclusive timer is mounted on the chip, and FIG. 8 is an example in which the timer is controlled using the sense amplifier activation signal SAON.

RWLE is an output signal of the timer 12 that determines a period during which the selected read word line is activated. When RWLE="H", the selected read word line is activated.

In the timer 12 of FIG. 7, when the read signal READ becomes "H", and an address transition signal ATD becomes "H", the output signal RWLE outputs "H" during a predetermined period determined by delay amount of a delay circuit. In other words, active time of the selected read word line and the selected column selection line is controlled by the delay amount of the delay circuit.

Further, in the timer 12 of FIG. 8, when the read signal READ becomes "H", and the address transition signal ATD becomes "H", the output signal RWLE becomes "H", so that at least one of the selected read word line and the selected column selection line is activated. Furthermore, after completion of the read, when the sense amplifier activation signal SAON becomes "L", at least one of the selected read word line and the selected column selection line is made non-active.

Here, in the magnetic random access memory, when considering a case in which the operation mechanism of the SRAM specification is employed, after the data of the Memory cell is judged by the sense amplifier, even though the read word line is made in the non-activated state, there is no defect on the operation. Therefore, the magnetic random access memory has good compatibility with the SRAM specification compared to the SRAM and the DRAM.

Figure 9:
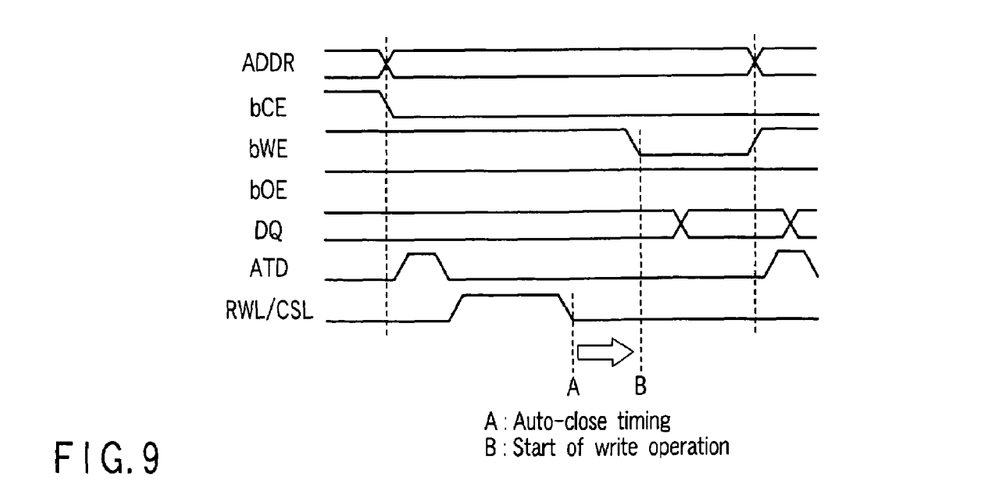
FIG. 9 is a view showing the operation waveform of the SRAM specification.

For example, when employing the SRAM specification in the SRAM or the DRAM, as shown in FIG. 9, in the case where the timing at which the write enable signal bWE becomes "L", that is, the timing for recognizing the writing operation is delayed than the timing at which the RWL/CSL becomes "L", that is, the timing of the auto-close, the read word line and the column selection line are not activated, therefore, there is a problem that the read word line and the column selection line should be activated again.

On the contrary, in the magnetic random access memory, the read and the writing are performed independently. Thus, even though the timing at which the write enable signal bWE becomes "L" is delayed compared the timing at which the RWL/CSL becomes "L", so that the read word line and the column selection line are not activated, there does not exist the above described problem because it is not necessary for the read word line and the column selection line to be activated at the time of writing.

In other words, the writing operation is executed independently with the auto-close operation after the read operation is started.

Therefore, for example, as a timer 12 shown in FIG. 8, it is effective that the low power consumption is achieved by determining the timing of putting the read word line and the column selection line in the non-active state due to the sense amplifier activation signal SAON.

Even though adding the auto-close function to the operation mechanism of the DRAM specification, it is possible to reduce the power consumption.

Figure 10:
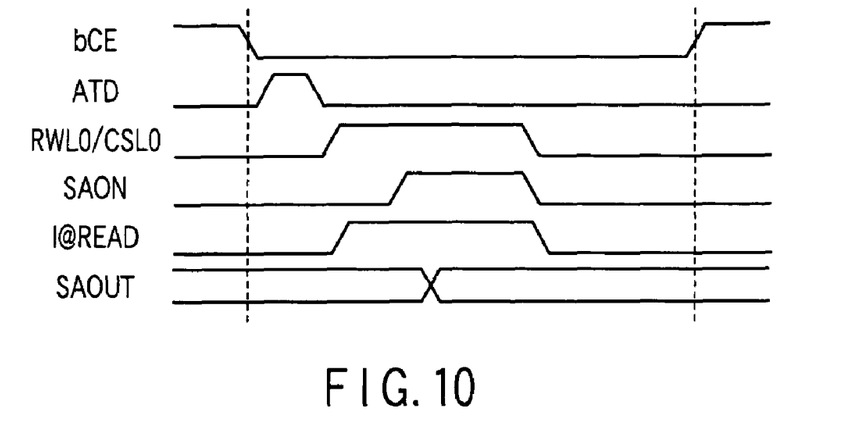
FIG. 10 is a view showing the operation waveform of the DRAM specification.

For example, in the timing of the DRAM specification as shown in FIG. 10, it is possible to reduce the power consumption, even though in the case where frequent accesses are entered, by rendering at least one of the selected read word line RWL0 and the selected column selection line CSL0 in the non activated state automatically, after a predetermined period from starting the read operation has elapsed.

As described above, according to the first embodiment, it is possible to realize low power consumption of the semiconductor memory with the resistance change element as the memory cell due to the auto-close function.

(2) Second Embodiment

Figure 11:
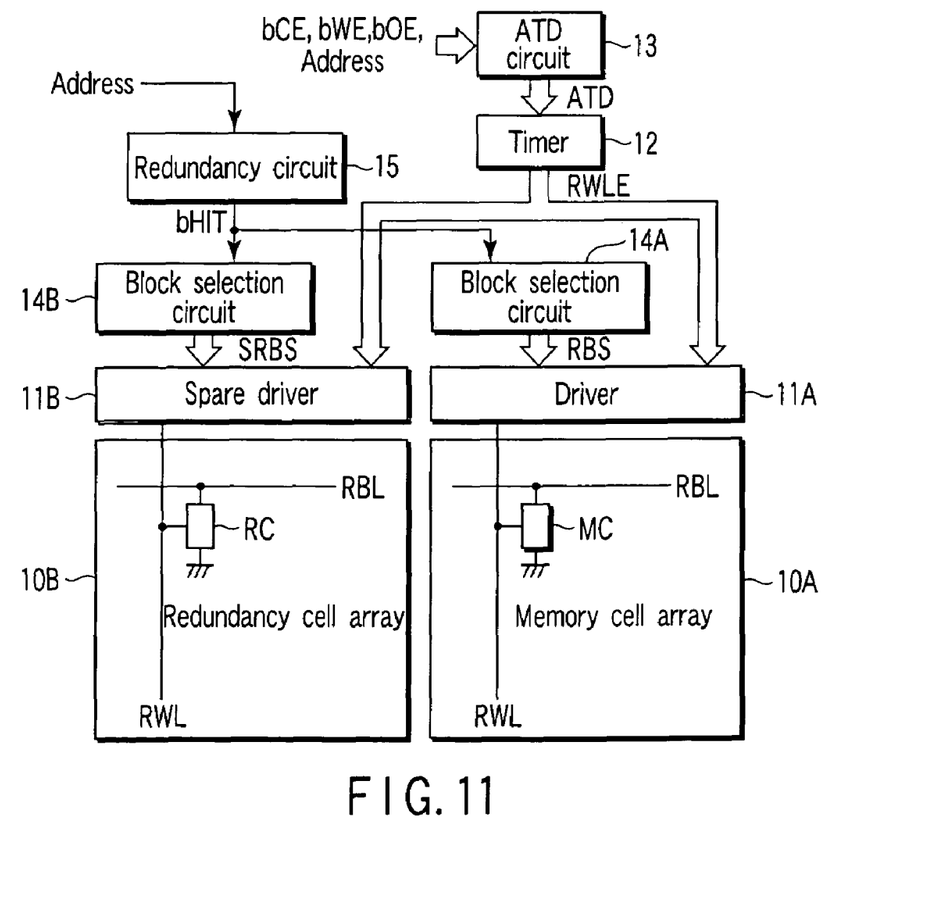
FIG. 11 is a view showing a magnetic random access memory of a second embodiment.

FIG. 11 shows principal parts of a magnetic random access memory.

This embodiment differs from the magnetic random access memory of FIG. 5 as the first embodiment in that there is provided a redundancy cell array 10B which has a redundancy cell RC for relieving defect bit.

As for the read circuit, it is possible to use one as it is which is disclosed in, for instance, FIG. 5, therefore, it is omitted here.

A redundancy circuit 15 judges whether or not selected address (in the present example, row) selected by an address signal Address includes a defect bit based on a redundancy data and the address signal Address stored in the chip in advance. In the case of including the defect bit, a hit signal bHIT is made "L"; in the case of including no defect bit, the hit signal bHIT is made "H".

When the hit signal bHIT is "H", a block selection circuit 14A makes its output signal RBS "H", and drives the read word line RWL in the memory cell array 10A using the driver 11A. At this time, a spare driver 11B results in non-operation state.

When the hit signal bHIT is "L", a block selection circuit 14B makes its output signal SRBS "H", and drives the read word line RWL in the redundancy cell array 10B using the spare driver 11B. At this time, the driver 11A results in non-operation state.

The timer 12 determines a period to drive the read word line RWL, and its output signal RWLE is inputted to both the driver 11A and the spare driver 11B. The ATD circuit 13 detects the transition of the address, and supplies the ATD signal to the timer 12.

Then, like the first embodiment, the operation is performed with the timing of the SRAM specification shown in FIG. 6 or the timing of the DRAM specification shown in FIG. 10.

Here, the selected read word line results in the non-activation state automatically after completion of the read, however, the hit signal bHIT is not reset depending on the output signal RWLE of the timer 12. For instance, the hit signal bHIT is latched continuously in the block selection circuits 14A, and 14B (half auto-close function).

The same control as this is capable of being performed about the selected column selection line. In other words, the half auto-close function is capable of being applied to the both or either one of the selected read word line and the selected column selection line.

Here, there is described the redundancy techniques.

The redundancy techniques for replacing the defect bit with a redundancy cell are well known as techniques for achieving improvement of manufacturing yield of the semiconductor memory. As for the replacement system, for instance, "redundancy block system" is attracting attention as one which is capable of obtaining high relief efficiency. (For instance, refer to "Fault-Tolerant Design for "256 Mb DRAM" T. Kirihata et. al., 1995 Symposium on VLSI Circuits Digest of Technical Paper, pp. 107 to 108)

Figure 12:
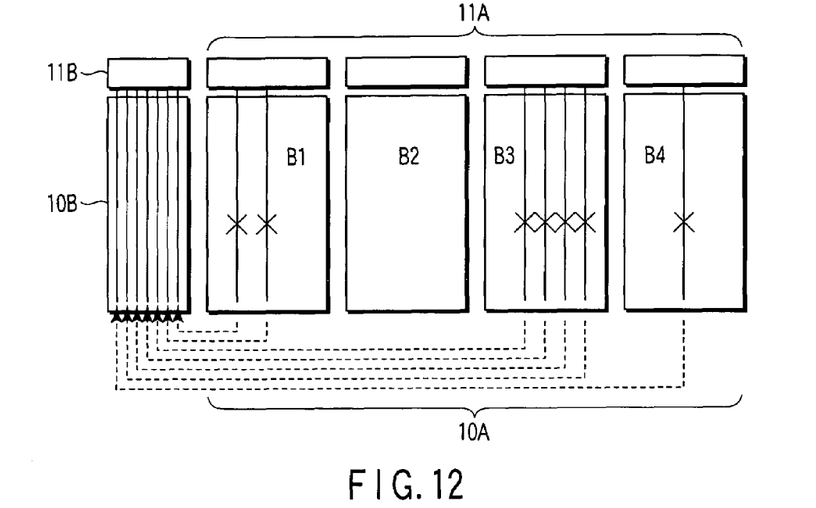
FIG. 12 is a view showing an outline of a block redundancy system.

FIG. 12 shows an outline of the redundancy block system.

The redundancy block system is a system in which a redundancy cell array (exclusive array) 10B having a redundancy cell is provided on the chip, and capable of relieving defects occurring within the memory cell array (relief domains B1, B2, B3 and B4) 10A, regardless of its position with the redundancy cell array 10B. This system is different from the techniques for providing the redundancy cell in each memory cell array.

In this example, four memory cell arrays 10A are defined as respective relief domains B1, B2, B3 and B4, and a case in which eight rows can be relieved by the redundancy cell array 10B is shown.

In this case, simply calculated, it becomes possible to relieve two rows per one memory cell array, however, in the redundancy block system, even though two or more defect rows exist within one memory cell array, if the total defect rows of four memory cell arrays are eight or less, it is possible to relieve the defects.

Therefore, this system contributes to improvement of relief efficiency of the chip in the case where, for instance, large gathered defects (great defects) occur in one position.

In the example of the present invention, the redundancy block system and the auto-close function are caused to coexist.

For instance, in the magnetic random access memory, since the read and the writing are performed independently, in the case where the SRAM specification is to be satisfied, there does not occur the problem as explained in FIG. 9. However, when the hit signal determining whether the memory cell is accessed or the redundancy cell array is accessed depending on the auto-close function is reset, there occurs the problem that the writing can not be performed.

Consequently, as described above, in the present example, so-called the half auto-close function is employed in which although the auto-close function is realized by supplying the output signal RWLE of the timer 12 to both the driver 11A and the spare driver 11B, the hit signal bHIT is not reset depending on the auto-close function.

Due to this, on the operation, it is possible to realize the magnetic random access memory satisfying completely the SRAM specification without any problem.

Figure 13:
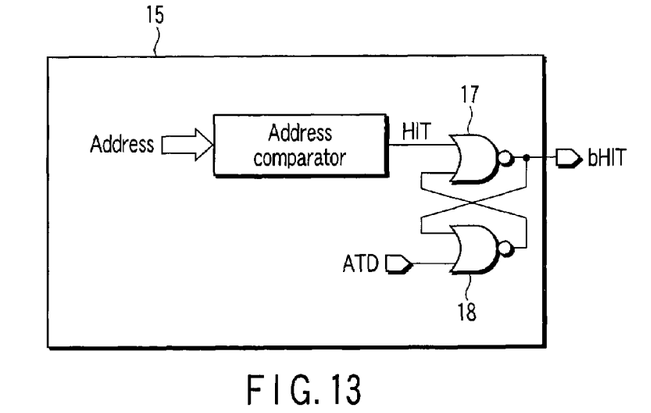
FIG. 13 is a view showing an example of a redundancy circuit.

FIG. 13 shows an example of a redundancy circuit.

An address signal (external address) Address is inputted to an address comparator 16. The address comparator 16 compares the address signal Address with the redundancy data indicating a defect row or a defect column; when the both agree with each other, the hit signal (pulse signal) HIT="H" is outputted, while when the both do not agree with each other, the hit signal HIT="L" is outputted.

When resulting in HIT="H", the output signal bHIT of the redundancy circuit 15 becomes "L". Then, even after the hit signal HIT changes from "H" to "L", the output of a NOR circuit 17 is "L", and the output of a NOR circuit 18 is "H" because of ATD="L". As a result, the bHIT continuously maintains "L". Then, when the transition of the address is performed resulting in ATD="H", since the output of the NOR circuit 18 changes into "L", the output signal bHIT of the redundancy circuit 15 becomes "H" (reset). Then, also after ATD changes from "H" to "L", since the output of the NOR circuit 18 is "L" and HIT="L", the bHIT continuously maintains "H".

When resulting in HIT="L", the output signal bHIT of the redundancy circuit 15 has a state with "H" maintained. After that, when the transition of the address is performed resulting in ATD="H", formally, the output signal bHIT of the redundancy circuit 15 is reset. Substantially, without any change, the output signal bHIT of the redundancy circuit 15 has the state with "H" maintained.

According to such a redundancy circuit, the value of the hit signal bHIT is determined by the output signal HIT of the address comparator 16 after the hit signal bHIT is reset by the ATD signal indicating the transition of the address. However, after that, it is latched in the redundancy circuit 15, and thus, it is not reset by the auto-close function.

Figure 14:
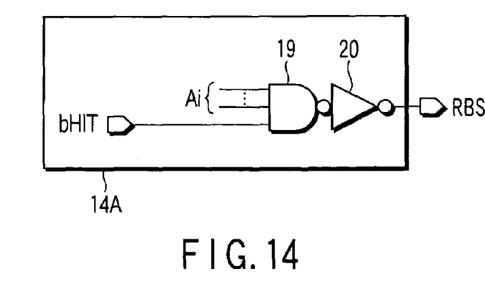
FIG. 14 is a view showing an example of a block selection circuit.
Figure 15:
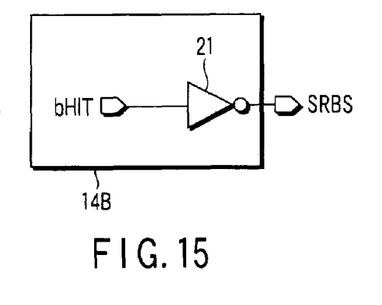
FIG. 15 is a view showing an example of the block selection circuit.

FIGS. 14 and 15 show examples of the block selection circuit.

The block selection circuit 14A corresponds to one row in the memory cell array. In other words, the block selection circuit of FIG. 14, for instance, exists corresponding to the number of the rows of the memory cell array.

The block selection circuit 14B corresponds to one relief row in the redundancy cell array. In other words, as shown in FIG. 12, in case of the semiconductor memory having the redundancy cell array 10B composed of eight rows, eight block selection circuits of FIG. 15 exist.

The address signal Ai and the hit signal bHIT are respectively inputted to a NAND circuit 19. Here, the address signal Ai, for instance, when $2^n$ rows exist, results in n bits. Further, the address signal Ai all of which results in "H" in only relevant to the block selection circuit 14A corresponding to the selected one row, while in the block selection circuit 14A corresponding to remaining all rows not selected, at least one bit becomes "L".

Then, in the case where the address signal Address of FIG. 11 selects the defect row of the memory cell array, since the hit signal bHIT becomes "L", a row block selection signal RBS becomes "L", and the driver 11A of FIG. 11 results in the non-operation state. Further, since a spare row block selection signal SRBS becomes "H", the spare driver 11B of FIG. 11 results in the operation state.

Furthermore, in the case where the address signal Address of FIG. 11 selects the row which does not include the defect bit of the memory cell array, since the hit signal bHIT becomes "H", the spare row block selection signal SRBS becomes "L", and the spare driver 11B of FIG. 11 results in non-operation state. Moreover, since the row block selection signal RBS becomes "H", the driver 11A of FIG. 11 results in operation state.

As described above, according to the second embodiment, it is possible to realize the semiconductor memory with low power consumption with the resistance change element as the memory cell due to the half auto-close function.

(3) Third Embodiment

Figure 16:
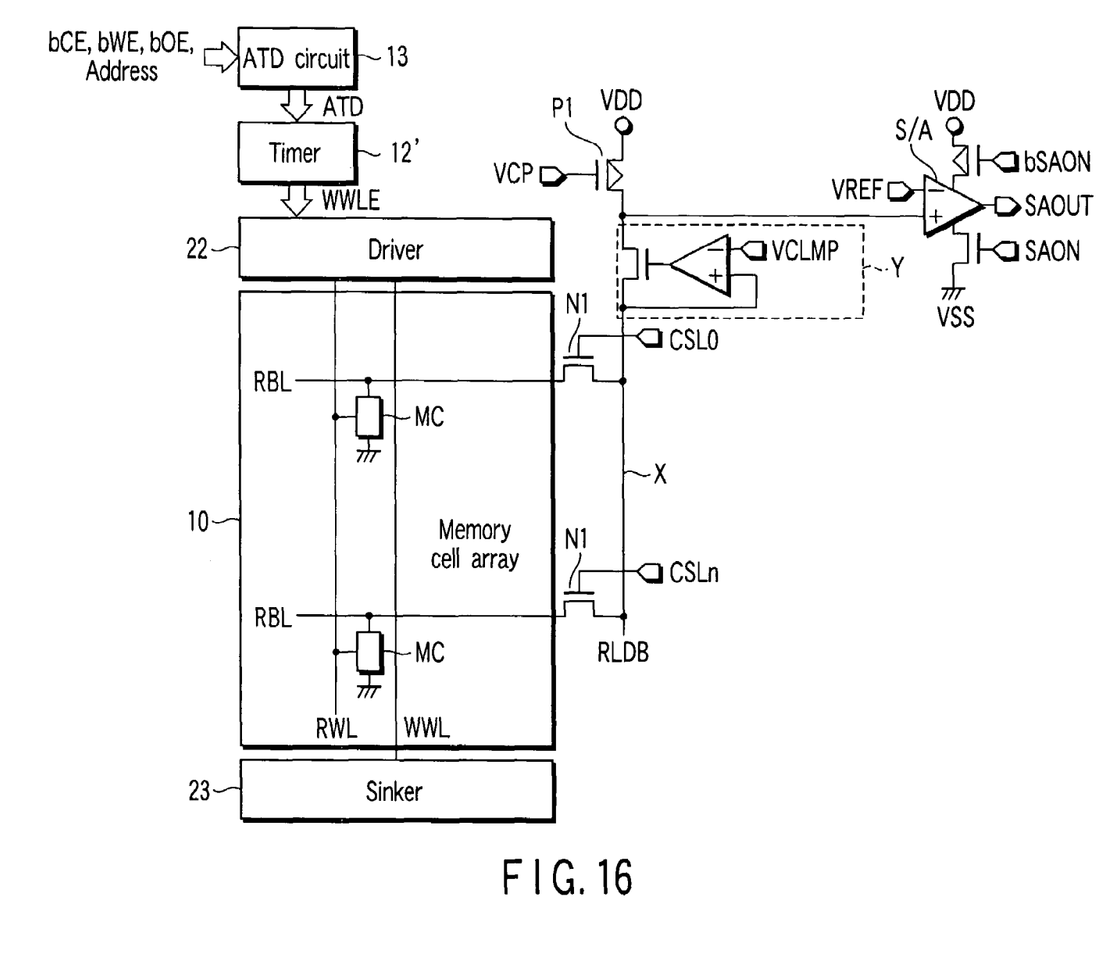
FIG. 16 is a view showing a magnetic random access memory of a third embodiment.

FIG. 16 shows principal parts of a magnetic random access memory.

A third embodiment relates to a magnetic random access memory of a magnetic field write type.

An output signal WWLE of a timer 12' is inputted to a driver 22 which drives a write word line WWL, and controls drive time of the write word line WWL. The ATD circuit 13, when detecting the transition of the address, outputs the ATD signal to the timer 12'.

First, when the transition of the address is performed, the timer 12' controls a driver 22 and a sinker 23 such that the write current flows in the selected write word line WWL during a fixed period from that time. Then, after this fixed period has elapsed, the write current flowing in the selected write word line WWL is interrupted.

Figure 17:
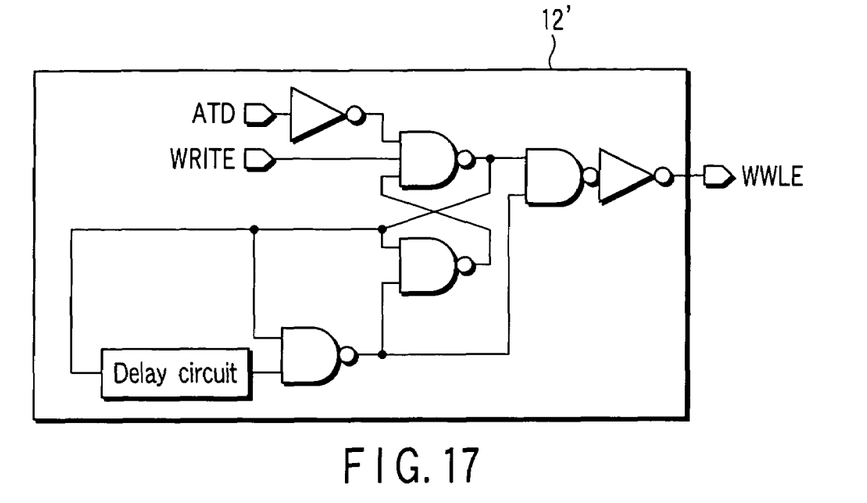
FIG. 17 is a view showing an example of the timer.

FIG. 17 shows an example of a timer.

The WWLE is the output signal of the timer 12' and determines a period in which the selected write word line WWL is activated. When WWLE="H", the selected write word line WWL is activated.

The output signal WWLE outputs "H" during a fixed period determined by delay amount of the delay circuit, when the write signal WRITE becomes "H" and the address transition signal ATD becomes "H". In other words, the active time of the selected write word line WWL is controlled by the delay amount of the delay circuit.

(4) Fourth Embodiment

Figure 18:
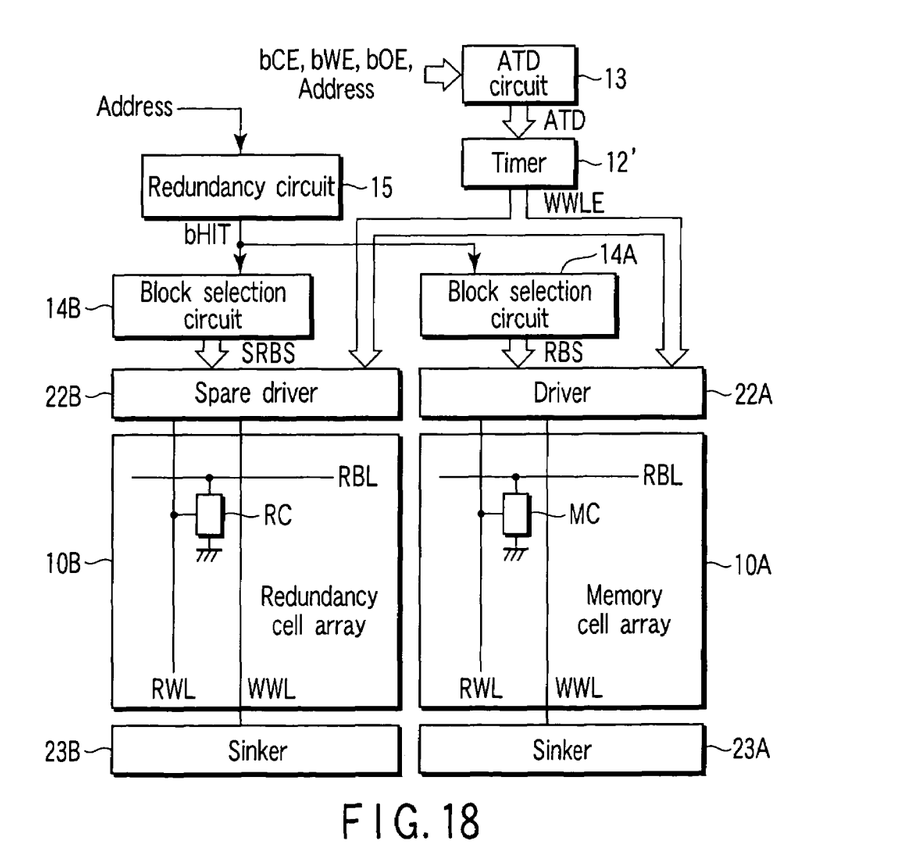
FIG. 18 is a view showing a magnetic random access memory of a fourth embodiment.

FIG. 18 shows principal parts of a magnetic random access memory.

This embodiment differs from the magnetic random access memory of FIG. 16 as the third embodiment in that there is provided a redundancy cell array 10B which has a redundancy cell RC for relieving defect bits.

As for the read circuit, for instance, since it is possible to use one as it is which is disclosed in FIG. 16, therefore, it is omitted here.

The redundancy circuit 15 judges whether or not the address (in the present example, it is row) selected by its address signal Address includes a defect bit based on the redundancy data stored in the chip in advance and the address signal Address. In the case where the defect bit is included, the hit signal bHIT is made "L", while if the defect bit is not included, the hit signal bHIT is made "H".

The block selection circuit 14A, when the hit signal bHIT is "H", drives the write word line WWL within the memory cell array 10A using the driver 22A while making its output signal RBS "H". At this time, the spare driver 22B results in the non-operation state.

The block selection circuit 14B, when the hit signal bHIT is "L", drives the write word line WWL within the redundancy cell array 10B using the spare driver 22B while making its output signal SRBS "H". At this time, the driver 22A results in the non-operation state.

The timer 12' determines the period to drive the write word line WWL; and its output signal WWLE is inputted to both of the driver 22A and the spare driver 22B. The ATD circuit 13 detects the transition of the address to supply the ATD signal to the timer 12'.

Figure 19:
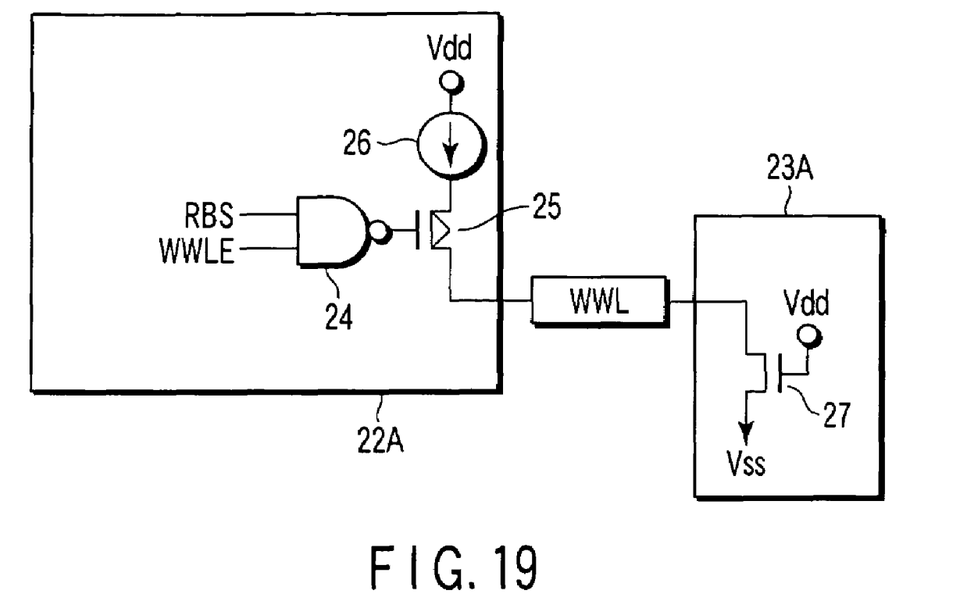
FIG. 19 is a view showing an example of a driver/sinker.

FIG. 19 shows an example of driver/sinker of the memory cell array.

The driver 22A and the sinker 23A correspond to one row within the memory cell array. In other words, the driver/sinker, for instance, exist corresponding to the number of the rows of the memory cell array.

The row block selection signal RBS and the output signal WWLE of the timer are inputted to a NAND circuit 24 each.

Here, the row block selection signal RBS includes the address information, thereby only the driver 22A corresponding to the selected one row is activated.

Therefore, in the selected one row of the memory cell array, at the time the row block selection signal RBS is "H", if the output signal WWLE of the timer becomes "H", the output signal of the NAND circuit 24 becomes "L", and a p-channel MOS transistor 25 becomes ON. Then, write current is supplied to the write word line WWL from a current source 26.

Further, when the output signal WWLE of the timer becomes "L", the output signal of the NAND circuit 24 becomes "H" and the p-channel MOS transistor 25 becomes OFF, thereby the write current supplied to the write word line WWL from the current source 26 is interrupted.

By the way, when the row block selection signal RBS is "L", the driver 22A results in non-operation state.

Figure 20:
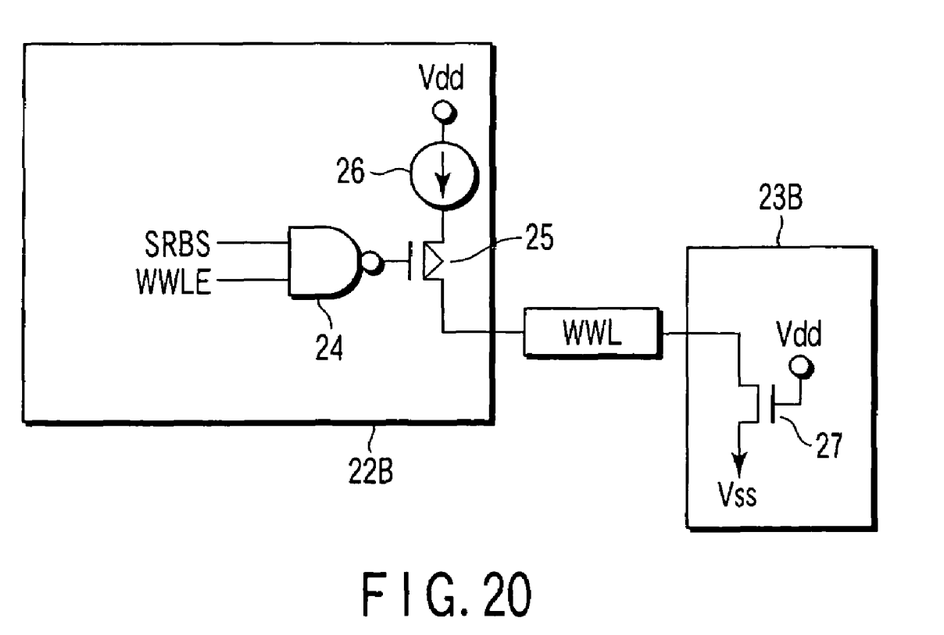
FIG. 20 is a view showing an example of the driver/sinker.

FIG. 20 shows an example of the driver/sinker of the redundancy cell array.

The spare driver 22B and the sinker 23B correspond to one relief row within the redundancy cell array. In other words, for instance, as shown in FIG. 12, in the case of the semiconductor memory having the redundancy cell array 10B composed of eight rows, there exist eight drivers/sinkers.

At the time the spare row block selection signal SRBS is "H", if the output signal WWLE of the timer becomes "H", the output signal of the NAND circuit 24 becomes "L", and the p-channel MOS transistor 25 becomes ON. Then, the write current is supplied to the write word line WWL from the current source 26.

Further, since when the output signal WWLE of the timer becomes "L", the output signal of the NAND circuit 24 becomes "H" and the p-channel MOS transistor 25 becomes OFF, the write current supplied to the write word line WWL from the current source 26 is interrupted.

By the way, when the spare row block selection signal SRBS is "L", the spare driver 22B results in the non-operation state.

(5) Fifth Embodiment

Figure 21:
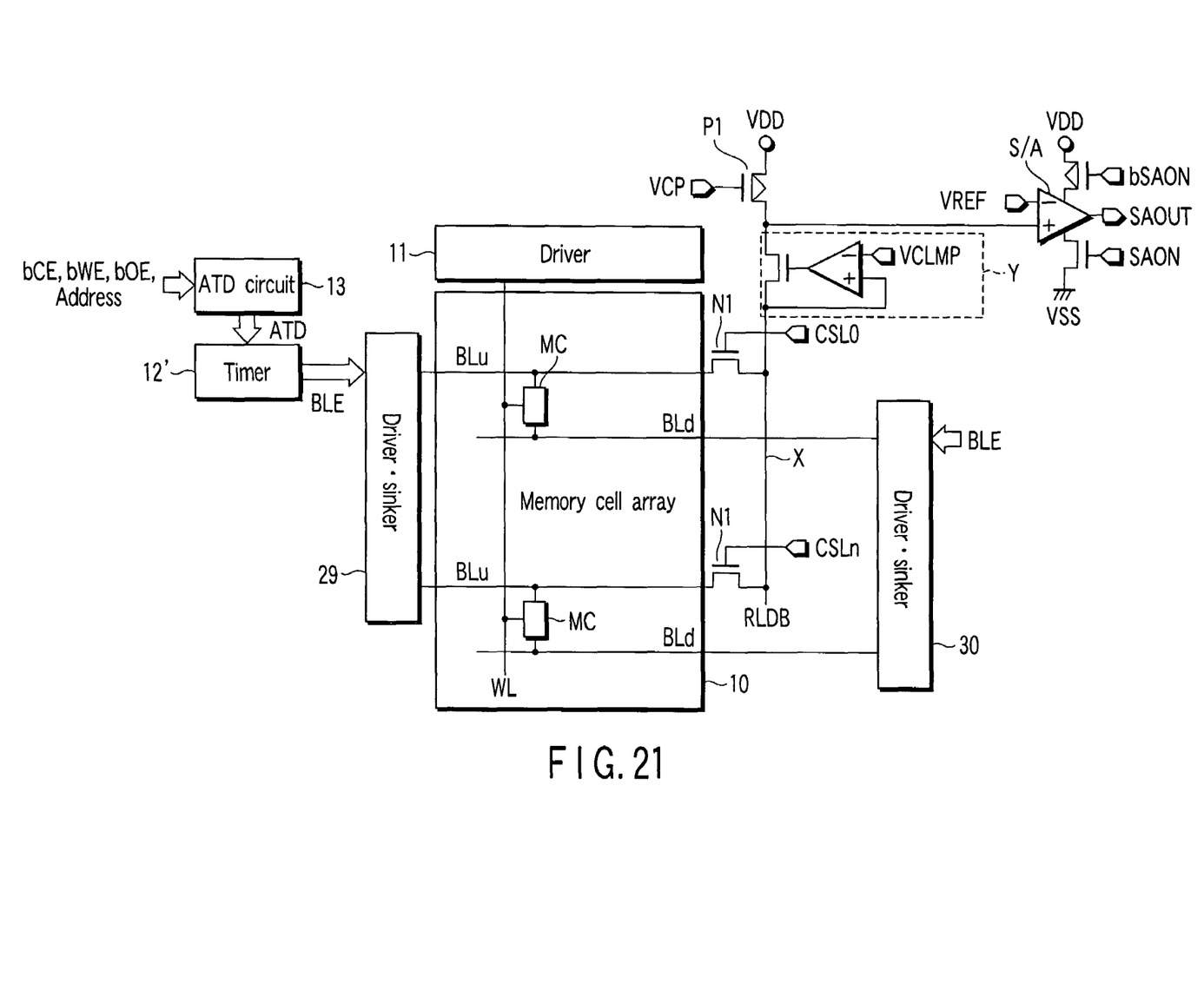
FIG. 21 is a view showing a magnetic random access memory of a fifth embodiment.

FIG. 21 shows principal parts of a magnetic random access memory.

A fifth embodiment relates to a spin injection write type magnetic random access memory.

The output signal BLE of the timer 12' is inputted to a driver/sinker 29, 30 for driving bit lines (write lines) BLu, BLd, and controls drive time of the bit lines BLu, BLd. The ATD circuit 13 outputs the ATD signal to the timer 12' when detecting the transition of the address.

First, when the transition of the address is performed, during a fixed time period from that time, the timer 12' controls the driver/sinker 29, 30 such that spin injection currents for the writing to the selected bit lines BLu, BLd flow. Then, after the fixed time period has elapsed, the timer 12' interrupts the spin injection current flowing in the selected bit lines BLu, BLd.

(6) Sixth Embodiment

Figure 22:
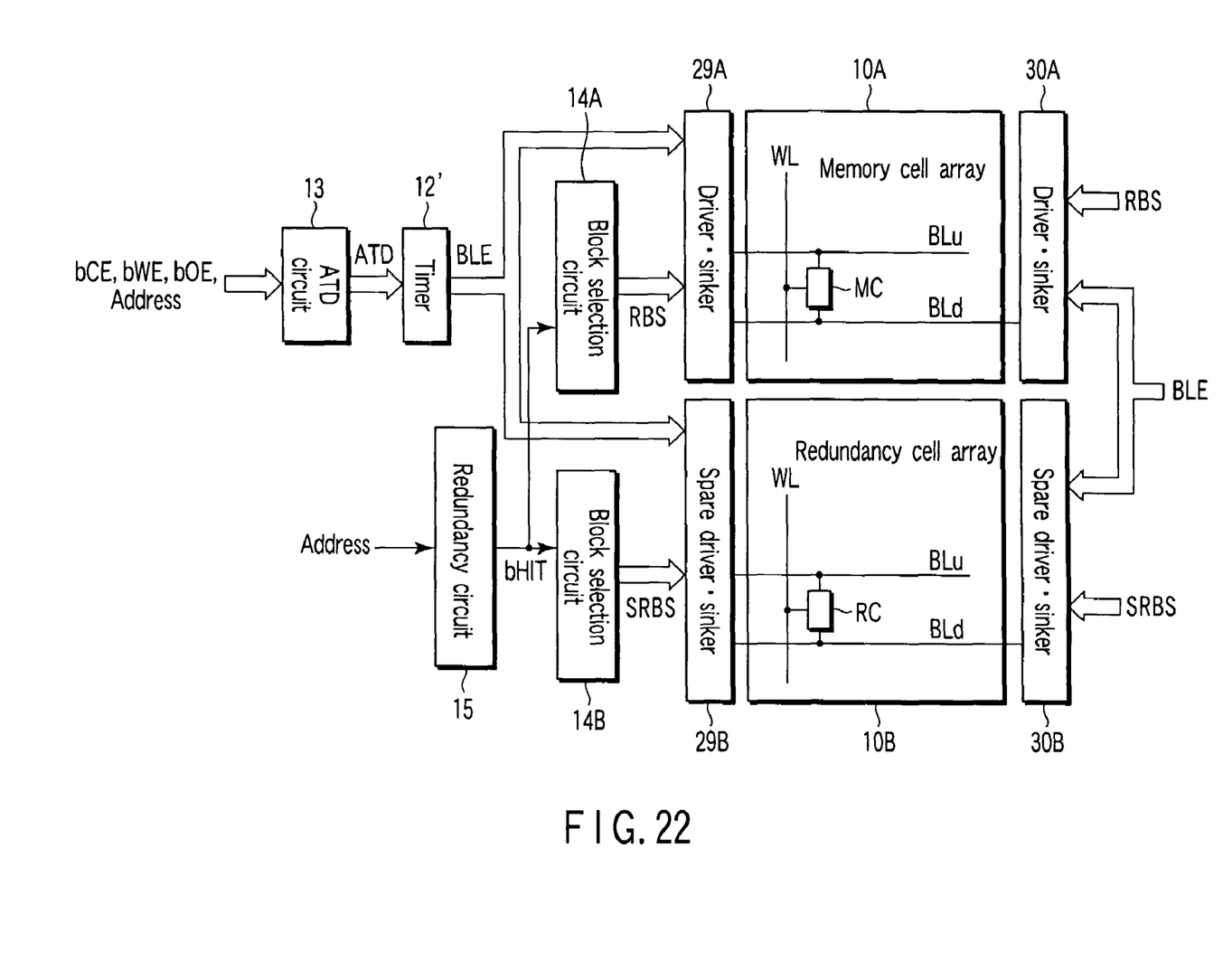
FIG. 22 is a view showing a magnetic random access memory of a sixth embodiment.

FIG. 22 shows principal parts of a magnetic random access memory.

This embodiment differs from the magnetic random access memory of FIG. 21 as the fifth embodiment in that there is provided a redundancy cell array 10B which has a redundancy cell RC for relieving defect bits.

As for the read circuit, for instance, since it is possible to use one as it is which is disclosed in FIG. 21, therefore, it is omitted here.

The redundancy circuit 15 judges whether or not the address (in the present example, row) selected by its address signal Address includes a defect bit based on the redundancy data stored in the chip in advance and the address signal Address. In the case where the defect bit is included, the hit signal bHIT is made "L", while if the defect bit is not included, the hit signal bHIT is made "H".

When the hit signal bHIT is "H", the block selection circuit 14A drives the bit lines BLu, BLd within the memory cell array 10A using a driver/sinker 29A, 30A while making its output signal RBS "H". At this time, a spare driver/sinker 29B, 30B results in the non-operation state.

When the hit signal bHIT is "L", the block selection circuit 14B drives the bit lines BLu, BLd within the redundancy cell array 10B using the spare driver/sinker 29B, 30B while making its output signal SRBS "H". At this time, the driver/sinker 29A, 30A results in the non-operation state.

The timer 12' determines the period to drive the bit lines BLu, BLd; and its output signal BLE is inputted to both of the driver/sinker 29A, 30A and the spare driver/sinker 29B, 30B. The ATD circuit 13 detects the transition of the address to supply the ATD signal to the timer 12'.

In the selected one row of the memory cell array 10A, at the time the row block selection signal RBS is "H", if the output signal BLE of the timer becomes "H", the spin injection current is supplied to the bit lines BLu, BLd. Further, when the output signal BLE of the timer becomes "L", the spin injection current is interrupted. When the row block selection signal RBS is "L", the driver/sinker 29A, 30A result in the non-operation state.

At the time the spare row block selection signal SRBS is "H", if the output signal BLE of the timer becomes "H", the spin injection current is supplied to the bit lines BLu, BLd within the redundancy cell array 10B. Further, when the output signal BLE of the timer becomes "L", the spin injection current is interrupted. The spare row block selection signal SRBS is "L", the spare driver/sinker 29B, 30B result in the non-operation state.

3. Conclusion

According to the examples of the present invention, it is possible to reduce the power consumption of the semiconductor memory with the resistance change element as the memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a memory cell as a resistance change element and a switching element which are connected in series;
    a read word line connected to a control terminal of the switching element;
    a circuit which executes an auto-close operation for causing the read word line to be subjected to non-activation automatically after a fixed period from start of a read operation;
    a redundancy cell; and
    a redundancy circuit which outputs a hit signal to select one of the memory cell and the redundancy cell,
    wherein the hit signal is not reset by the auto-close operation.

2. The semiconductor memory according to claim 1, wherein the semiconductor memory conforms to a SRAM specification in which operation moves to the read operation when the transition of the address is performed.

3. The semiconductor memory according to claim 1, wherein the semiconductor memory conforms to a DRAM specification in which a chip has a standby state or an active state.

4. The semiconductor memory according to claim 1, wherein the resistance change element is a magnetoresistive element.

5. A semiconductor memory comprising:
    a memory cell as a resistance change element;
    a read line connected to the memory cell;
    a switching element connected between the read line and a sense amplifier;
    a column selection line connected to a control terminal of the switching element;
    a circuit which executes an auto-close operation for causing the column selection line to be subjected to non-activation automatically after a fixed period from start of a read operation;
    a redundancy cell; and
    a redundancy circuit which outputs a hit signal to select one of the memory cell and the redundancy cell,
    wherein the hit signal is not reset by the auto-close operation.

6. The semiconductor memory according to claim 5, wherein the semiconductor memory conforms to a SRAM specification in which operation moves to the read operation when the transition of the address is performed.

7. The semiconductor memory according to claim 5, wherein the semiconductor memory conforms to a DRAM specification in which a chip has a standby state or an active state.

8. The semiconductor memory according to claim 5, wherein the resistance change element is a magnetoresistive element.

* * * * *